(12) United States Patent
Wang et al.

(10) Patent No.: US 9,287,137 B2
(45) Date of Patent: Mar. 15, 2016

(54) METHODS FOR DEPOSITING A SILICON CONTAINING LAYER WITH ARGON GAS DILUTION

(71) Applicants: Qunhua Wang, San Jose, CA (US); Weijie Wang, Cupertino, CA (US); Young Jin Choi, Santa Clara, CA (US); Seon-Mee Cho, Santa Clara, CA (US); Yi Cui, San Jose, CA (US); Beom Soo Park, Cupertino, CA (US); Soo Young Choi, Fremont, CA (US)

(72) Inventors: Qunhua Wang, San Jose, CA (US); Weijie Wang, Cupertino, CA (US); Young Jin Choi, Santa Clara, CA (US); Seon-Mee Cho, Santa Clara, CA (US); Yi Cui, San Jose, CA (US); Beom Soo Park, Cupertino, CA (US); Soo Young Choi, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 57 days.

(21) Appl. No.: 13/630,901

(22) Filed: Sep. 28, 2012

(65) Prior Publication Data

US 2013/0087783 A1    Apr. 11, 2013

Related U.S. Application Data

(60) Provisional application No. 61/544,432, filed on Oct. 7, 2011, provisional application No. 61/611,532, filed on Mar. 15, 2012.

(51) Int. Cl.
*H01L 29/10* (2006.01)
*H01L 29/12* (2006.01)
(Continued)

(52) U.S. Cl.
CPC .............. *H01L 21/316* (2013.01); *C23C 16/24* (2013.01); *C23C 16/345* (2013.01); *C23C 16/401* (2013.01); *C23C 16/505* (2013.01); *C23C 16/56* (2013.01); *H01L 21/0262* (2013.01); *H01L 21/02422* (2013.01); *H01L 21/02425* (2013.01); *H01L 21/02488* (2013.01);
(Continued)

(58) Field of Classification Search
CPC ................... H01L 29/66757; H01L 29/78675
USPC .................................. 257/43, 213; 349/42, 46
See application file for complete search history.

(56) References Cited

U.S. PATENT DOCUMENTS 5,294,811 A    3/1994  Aoyama et al.
5,942,050 A    8/1999  Green et al.
(Continued)

FOREIGN PATENT DOCUMENTS

EP      0 994 515 A2    4/2000
JP      2007-262541 A   10/2007
KR      2006-0077554 A   7/2006

OTHER PUBLICATIONS

PCT International Search Report and Written Opinion of PCT/US2012/056928 dated Mar. 8, 2013.

*Primary Examiner* — David Vu
*Assistant Examiner* — Brandon Fox
(74) *Attorney, Agent, or Firm* — Patterson & Sheridan, LLP

(57) ABSTRACT

Embodiments of the disclosure generally provide methods of forming a silicon containing layers in TFT devices. The silicon can be used to form the active channel in a LTPS TFT or be utilized as an element in a gate dielectric layer, a passivation layer or even an etch stop layer. The silicon containing layer is deposited by a vapor deposition process whereby an inert gas, such as argon, is introduced along with the silicon precursor. The inert gas functions to drive out weak, dangling silicon-hydrogen bonds or silicon-silicon bonds so that strong silicon-silicon or silicon-oxygen bonds remain to form a substantially hydrogen free silicon containing layer.

16 Claims, 6 Drawing Sheets

(51) Int. Cl.
  *H01L 21/316* (2006.01)
  *H01L 29/786* (2006.01)
  *H01L 21/31* (2006.01)
  *H01L 21/02* (2006.01)
  *C23C 16/24* (2006.01)
  *C23C 16/34* (2006.01)
  *C23C 16/40* (2006.01)
  *C23C 16/505* (2006.01)
  *C23C 16/56* (2006.01)
  *H01L 29/66* (2006.01)
  *H01L 21/77* (2006.01)

(52) U.S. Cl.
  CPC ... *H01L 21/02532* (2013.01); *H01L 21/02595* (2013.01); *H01L 21/02664* (2013.01); *H01L 21/02675* (2013.01); *H01L 21/31* (2013.01); *H01L 29/66757* (2013.01); *H01L 29/786* (2013.01); *H01L 29/7869* (2013.01); *H01L 2021/775* (2013.01)

(56) References Cited

U.S. PATENT DOCUMENTS

| | | | |
|---|---|---|---|
| 6,190,932 B1 | 2/2001 | Yoshimi et al. | |
| 6,200,825 B1 | 3/2001 | Yoshimi et al. | |
| 6,265,288 B1 | 7/2001 | Okamoto et al. | |
| 6,297,443 B1 | 10/2001 | Nakajima et al. | |
| 6,309,906 B1 | 10/2001 | Meier et al. | |
| 6,326,304 B1 | 12/2001 | Yoshimi et al. | |
| 6,337,224 B1 | 1/2002 | Okamoto et al. | |
| 6,566,159 B2 | 5/2003 | Sawada et al. | |
| 6,673,659 B2 * | 1/2004 | Sakama | H01L 21/67236 257/347 |
| 6,869,838 B2 * | 3/2005 | Law et al. | 438/207 |
| 6,972,433 B2 * | 12/2005 | Miyasaka | 257/66 |
| 6,989,553 B2 | 1/2006 | Yokogawa et al. | |
| 7,026,219 B2 * | 4/2006 | Pomarede et al. | 438/285 |
| 7,074,641 B2 | 7/2006 | Kondo et al. | |
| 7,314,526 B1 | 1/2008 | Preti et al. | |
| 2002/0033191 A1 | 3/2002 | Kondo et al. | |
| 2002/0113264 A1 | 8/2002 | Horikoshi et al. | |
| 2003/0219540 A1 * | 11/2003 | Law et al. | 427/376.2 |
| 2004/0082097 A1 | 4/2004 | Lohmeyer et al. | |
| 2004/0155245 A1 * | 8/2004 | Okumura | H01L 29/0603 257/66 |
| 2004/0238851 A1 | 12/2004 | Flores et al. | |
| 2005/0164424 A1 * | 7/2005 | Voutsas | 438/96 |
| 2005/0251990 A1 | 11/2005 | Choi et al. | |
| 2005/0260347 A1 * | 11/2005 | Narwankar et al. | 427/248.1 |
| 2006/0060138 A1 | 3/2006 | Keller et al. | |
| 2006/0240630 A1 | 10/2006 | Bauer et al. | |
| 2007/0039942 A1 | 2/2007 | Leung et al. | |
| 2007/0298590 A1 | 12/2007 | Choi et al. | |
| 2009/0001432 A1 * | 1/2009 | Kim et al. | 257/288 |
| 2009/0008645 A1 * | 1/2009 | Yamazaki et al. | 257/59 |
| 2009/0065784 A1 | 3/2009 | Kobayashi et al. | |
| 2009/0134397 A1 * | 5/2009 | Yokoi et al. | 257/72 |
| 2010/0001272 A1 | 1/2010 | Ye | |
| 2010/0301329 A1 | 12/2010 | Asano et al. | |

* cited by examiner

METHODS FOR DEPOSITING A SILICON CONTAINING LAYER WITH ARGON GAS DILUTION

CROSS-REFERENCE TO RELATED APPLICATIONS

This application claims benefit of U.S. Provisional Application Ser. No. 61/544,432 filed Oct. 7, 2011 and U.S. Provisional Application Ser. No. 61/611,532, filed Mar. 15, 2012, both of which are incorporated by reference in their entirety.

BACKGROUND OF THE INVENTION

1. Field of the Invention

Embodiments of the present invention generally relate to methods for forming a silicon containing layer. More particularly, this invention relates to methods for forming a silicon containing layer that may be used in thin film transistor (TFT) devices.

2. Description of the Related Art

Plasma display panels and liquid crystal displays are frequently used for flat panel displays. Liquid crystal displays (LCD) generally contain two glass substrates joined together with a layer of a liquid crystal material sandwiched therebetween. The glass substrate may be a semiconductor substrate, or may be a transparent substrate such as glass, quartz, sapphire or a clear plastic film. The LCD may also contain light emitting diodes for back lighting.

As the resolution requirements for LCDs increase, it has become desirable to control a large number of separate areas of the liquid crystal cell, called pixels. In a modern display panel, more than 1,000,000 pixels may be present. At least the same number of transistors is formed on the glass substrate so that each pixel can be switched between an energized and de-energized state relative to the other pixels disposed on the substrate.

Silicon containing materials have become the building block for most TFTs. Silicon containing materials have been used to form the channel material, such as polysilicon for a low temperature polysilicon (LTPS) TFT and as an element utilized in forming a gate dielectric layer, interface layer, passivation layer or even an etch stop layer in a TFT.

Therefore, there is a need in the art for methods of forming TFTs that have stable and reliable performance utilizing silicon containing materials.

SUMMARY OF THE INVENTION

Embodiments of the disclosure generally provide methods of forming a silicon containing layer in TFT, OLED, LED, and solar cell devices. The silicon containing layer can be used to form the active channel in TFT devices, including LTPS, metal oxide TFT devices and the like, or be utilized as an element in a gate dielectric layer, an interface layer, passivation layer or even an etch stop layer. The silicon containing layer is deposited by a vapor deposition process whereby an inert gas, such as argon, is introduced along with the silicon containing precursor. The inert gas functions to drive out weak, dangling silicon-hydrogen bonds or silicon-silicon bonds so that strong silicon-silicon or silicon-oxygen bonds remain.

In one embodiment, a method for forming a silicon containing layer on a substrate is disclosed. The method includes transferring a substrate into a processing chamber and supplying a gas mixture having a silicon-based gas, an inert gas and substantially no hydrogen gas into the processing chamber. The gas mixture has a volumetric flow rate per surface area of substrate of the inert gas that is between about 1.8 times to about 79 times a volumetric flow rate per surface area of substrate of the silicon-based gas. The method additionally includes applying a RF power to an electrode to ignite the gas mixture into a plasma and forming an amorphous silicon layer on the substrate.

In another embodiment, a method for forming a silicon oxide layer is disclosed. The method comprises supplying a gas mixture having a silicon-based gas, an inert gas, and an oxygen containing gas into a processing chamber. The gas mixture has a volumetric flow rate per surface area of substrate of the inert gas that is between about 11 times to about 80 times a volumetric flow rate per surface area of substrate of the silicon-based gas. The method also comprises applying a RF power to ignite the gas mixture into a plasma and forming a silicon oxide layer on the substrate.

In yet another embodiment, a metal oxide TFT device includes a substrate, a gate insulating layer disposed on the substrate, wherein the gate insulating layer includes a substantially hydrogen free silicon oxide layer, an active channel disposed on the gate insulating layer, wherein the active channel includes at least one of InGaZnO, InGaZnON, ZnO, ZnON, ZnSnO, CdSnO, GaSnO, TiSnO, CuAlO, SrCuO, LaCuOS, GaN, InGaN, AlGaN or InGaAlN, a source-drain electrode disposed on the active channel, and a passivation layer disposed on the source-drain electrode layer, wherein the passivation layer includes a substantially hydrogen free silicon oxide layer.

In still another embodiment, a metal oxide TFT device includes a substrate, and an active channel disposed between a source-drain electrode and a gate insulating layer on the substrate, wherein an interface formed between the active channel and the gate insulating layer includes a substantially hydrogen free dielectric surface.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the disclosure generally provide methods of forming a silicon containing layer in TFT devices. The silicon containing layer can be used to form the active channel in a LTPS TFT or other suitable metal oxide TFT devices or be utilized as an element in a gate dielectric layer, an interface layer, a passivation layer or even an etch stop layer. The silicon containing layer is deposited by a vapor deposition process whereby an inert gas, such as argon, is introduced along with the silicon precursor. The inert gas functions to drive out weak, dangling silicon-hydrogen bonds or silicon-silicon bonds so that strong silicon-silicon or silicon-oxygen bonds remain.

In one embodiment, a method of forming an amorphous silicon layer which may be later transformed into a polysilicon layer is disclosed. The amorphous silicon layer may be used in a LTPS TFT device as the channel material. Alternatively, an amorphous silicon layer, silicon oxide layer, silicon nitride layer, silicon oxynitride layer or other suitable silicon containing layer formed by the methods described herein may also be used in suitable TFT devices, such as metal oxide TFT devices. The amorphous silicon layer, silicon oxide layer, silicon nitride layer, silicon oxynitride layer or other suitable silicon containing layers and the like may also be used in photodiodes, semiconductor diodes, light-emitting diodes (LEDs), or organic light-emitting diodes (OLEDs), or other display applications. The amorphous silicon layer, silicon oxide layer, silicon nitride layer, silicon oxynitride layer provide high film quality and stability and low film leakage with minimum hydrogen content, thereby efficiently enhancing the electrical performance of transistor devices. It is noted that the amorphous silicon layer may be used in other suitable devices in addition to the applications noted above.

Figure 1:
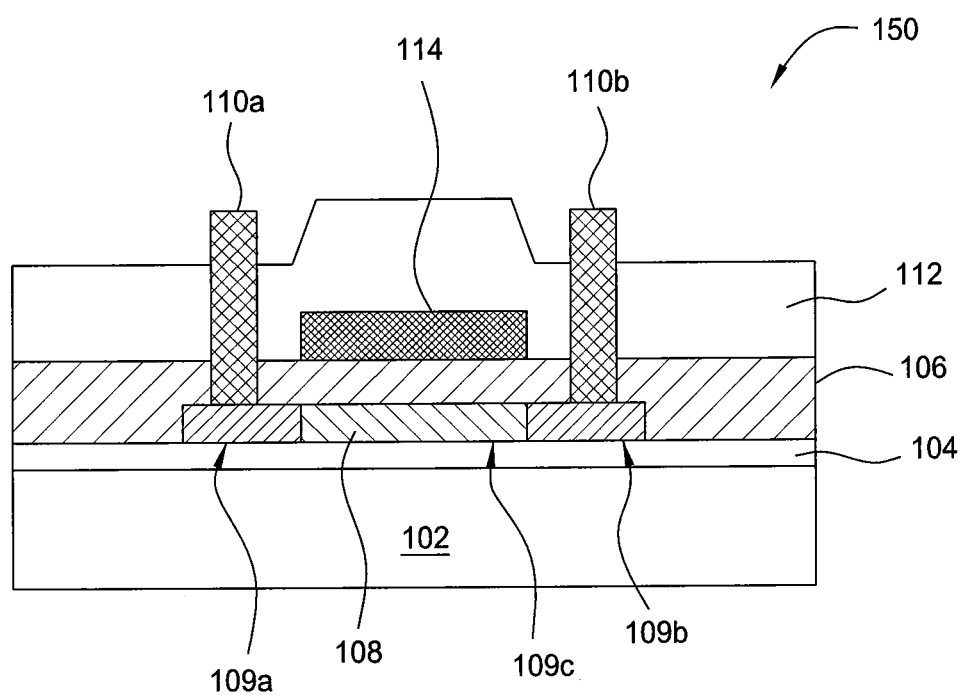
FIG. 1 is a sectional view of a thin film transistor device structure.

An exemplary embodiment of a LTPS TFT device 150 is shown in FIG. 1. LTPS TFT devices are MOS devices built with a source region 109a, channel region 109c, and drain region 109b formed on an optically transparent substrate 102 with or without an optional dielectric layer 104 disposed thereon. The source region 109a, channel region 109c, and drain region 109b are generally formed from an initially deposited amorphous silicon (a-Si) layer that is later thermal processed (e.g., annealed) to form a polysilicon layer. The source, channel and drain regions 109a, 109c, 109b can be formed by patterning areas on the optically transparent substrate 102 and ion doping the deposited initial a-Si layer, which is then thermally processed to form the polysilicon layer. A gate dielectric layer 106 is then deposited on top of the deposited polysilicon layer(s) to isolate a gate electrode 114 from the channel region 109c, source region 109a and drain region 109b. The gate electrode 114 is formed on top of the gate dielectric layer 106. An insulating layer 112 and device connections 110a, 110b are then made through the insulating layer 112 to allow control of the TFT device 150.

The performance of a LTPS TFT device 150 is dependent on the quality of the films that are deposited to form the MOS structure. The key performance elements of a MOS device are the qualities of the polysilicon channel layer 108, the gate dielectric layer 106, and the p-Si channel layer/gate dielectric layer interface. The quality of the p-Si channel layer 108 has received a lot of attention in recent years. As discussed above, the p-Si channel layer 108 is initially formed as an amorphous silicon layer and then heated up to about 450 degrees Celsius or greater to perform a dehydrogenation process to remove hydrogen from the amorphous silicon layer. After the dehydrogenation process, a laser annealing process may be performed to transform the amorphous silicon layer into a polysilicon layer. Subsequently, a gate insulator or other suitable layers may be formed thereon to complete the device structure.

An excess amount of hydrogen elements (e.g., an overly high concentration of hydrogen content) in the amorphous silicon layer may penetrate into the adjacent gate dielectric layer 106 or other adjacent layers, prior to forming the polysilicon channel layer 108, thereby resulting in current leakage or other types of device failure. The amorphous silicon layer may be formed by a suitable vapor deposition process such as plasma enhanced chemical vapor deposition (PECVD).

Figure 2:
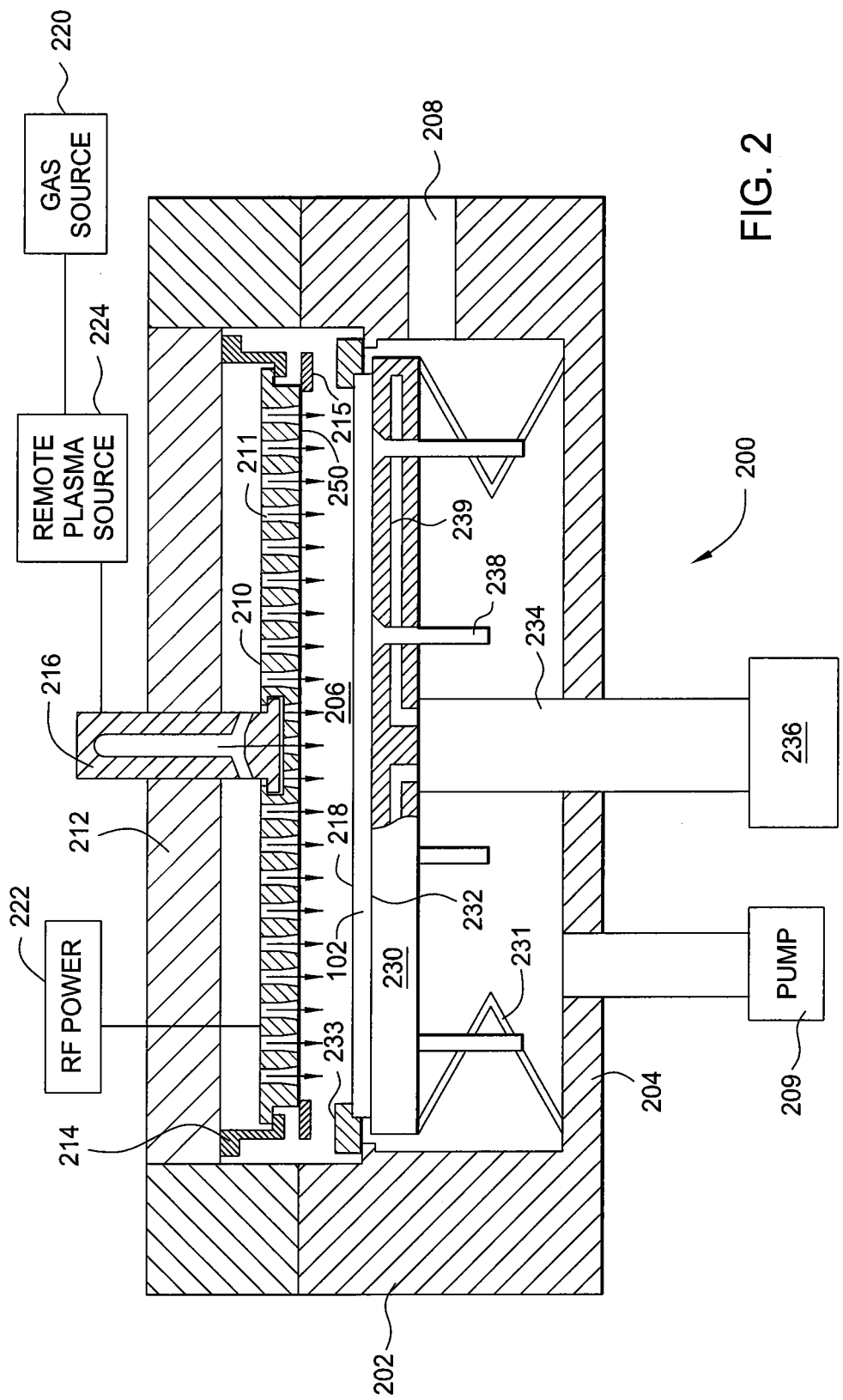
FIG. 2 depicts a sectional view of the processing chamber that may be used to deposit an amorphous silicon layer in accordance with one embodiment of the present invention.

FIG. 2 is a schematic cross-section view of one embodiment of a PECVD chamber 200 in which an amorphous silicon layer or other silicon containing layer, such as silicon oxide, may be formed therefrom. One suitable PECVD chamber is available from Applied Materials, Inc., located in Santa Clara, Calif. It is contemplated that other deposition chambers, including those from other manufacturers, may be utilized to practice the present invention.

The chamber 200 generally includes walls 202, a bottom 204 and a lid 212. A gas distribution plate 210 and substrate support assembly 230 which define a process volume 206. The process volume 206 is accessed through an opening 208 formed through the wall 202 such that a substrate 102 may be transferred into and out of the chamber 200.

The substrate support assembly 230 includes a substrate receiving surface 232 for supporting the substrate 102 thereon. The substrate receiving surface 232 is generally the same size as, or slightly larger than, the substrate 102. A stem 234 couples the substrate support assembly 230 to a lift system 236 which raises and lowers the substrate support assembly 230 between substrate transfer and processing positions. A shadow frame 233 may be optionally placed over periphery of the substrate 102 when processing to prevent deposition on the edge of the substrate 102. Lift pins 238 are moveably disposed through the substrate support assembly 230 and are adapted to space the substrate 102 from the substrate receiving surface 232 during substrate 102 insertion and removal. The substrate support assembly 230 may also include heating and/or cooling elements 239 utilized to maintain the substrate support assembly 230 at a desired temperature. The substrate support assembly 230 may also include RF return straps 231, to shorten the RF return path, around the periphery of the substrate support assembly 230.

The gas distribution plate 210 is coupled to the lid 212 or walls 202 of the chamber 200 at its periphery by a suspension 214. The gas distribution plate 210 may also be coupled to the lid 212 by one or more center supports 216 to help prevent sag and/or control the straightness/curvature of the gas distribution plate 210. In one embodiment, the gas distribution plate 210 has different configurations with different dimensions. In an exemplary embodiment, the gas distribution plate 210 has a quadrilateral downstream surface 250. The downstream surface 250 has a plurality of apertures 211 formed therein facing an upper surface 218 of the substrate 102 disposed on the substrate support assembly 230. The apertures 211 may have different shape, numbers, densities, dimensions, and distributions across the gas distribution plate 210.

A gas source 220 is coupled to the lid 212 to provide gas through the lid 212, and then through the apertures 211 formed in the gas distribution plate 210 to the process volume 206. A vacuum pump 209 is coupled to the chamber 200 to maintain the gas in the process volume 206 at a desired pressure.

An RF power source 222 is coupled to the lid 212 and/or to the gas distribution plate 210 to provide a RF power that creates an electric field between the gas distribution plate 210 and the substrate support assembly 230 so that a plasma may be generated from the gases between the gas distribution plate 210 and the substrate support assembly 230. The RF power may be applied at one or more RF frequencies. For example, RF power may be applied at a frequency between about 0.3 MHz and about 200 MHz. In one embodiment the RF power is provided at a frequency of 13.56 MHz.

A remote plasma source 224, such as an inductively coupled remote plasma source, may also be coupled between the gas source and the backing plate. Between processing substrates, a cleaning gas may be energized in the remote plasma source 224 to remotely provide plasma utilized to clean chamber components. The cleaning gas may be further excited by the RF power provided to the gas distribution plate 210 by the RF power source 222. Suitable cleaning gases include, but are not limited to, $NF_3$, $F_2$, and $SF_6$.

In one embodiment, the substrate 102 that may be processed in the chamber 200 may have a surface area of 10,000 $cm^2$ or more, such as 40,000 $cm^2$ or more, for example about 55,000 $cm^2$ or more. It is understood that after processing the substrate may be cut to form smaller devices.

In one embodiment, the heating and/or cooling elements 239 may be set to provide a substrate support assembly temperature during deposition of about 400 degrees Celsius or less, for example between about 100 degrees Celsius and about 400 degrees Celsius, or between about 150 degrees Celsius and about 300 degrees Celsius, such as about 200 degrees Celsius.

The spacing during deposition between the upper surface 218 of the substrate 102 disposed on the substrate receiving surface 232 and the gas distribution plate 210 may generally vary between 400 mil and about 1,200 mil, such as between 400 mil and about 800 mil, or other distance between the substrate 102 and gas distribution plate 210 selected to provide desired deposition results. In one exemplary embodiment for a concave downstream surface gas distribution plate 210 is utilized, the spacing between the center portion of the edge of the plate 210 and the substrate receiving surface 232 is between about 400 mils and about 1400 mils and the spacing between the corners of the plate 210 and the substrate receiving surface 232 is between about 300 mils and about 1200 mils.

Figure 3:
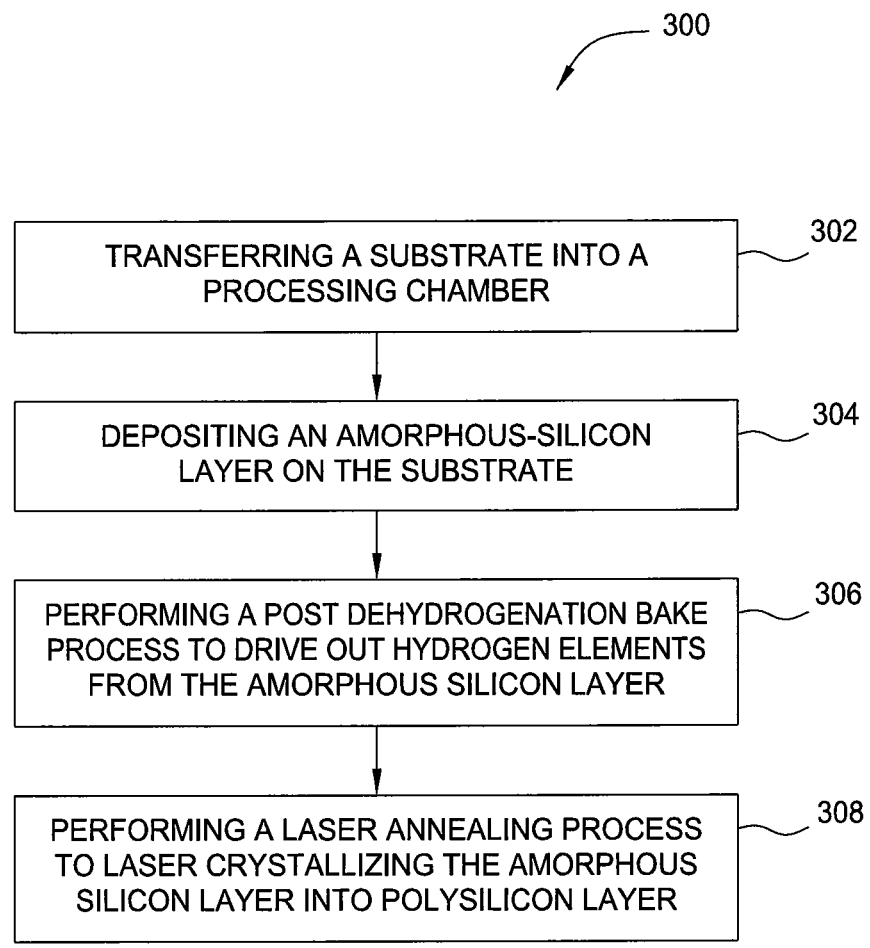
FIG. 3 depicts a process flow diagram of one embodiment of a method of forming an amorphous silicon layer and later being transformed into a polysilicon layer that may be used in a device structure.

FIG. 3 depicts a flow diagram of one embodiment of a deposition process 300 that may be practiced in the chamber 200, as described in FIG. 2, or other suitable processing chamber. The process 300 illustrates a method of depositing an amorphous silicon layer or other suitable silicon containing layer that may be used in TFT devices, or diode devices. In one embodiment, the silicon containing layer may be used, alone or in combination with, any other suitable films to improve electrical properties and performance in TFT or diode devices. In one particular embodiment, the silicon containing layer as described is an amorphous silicon layer can then later be thermally processed to form a polysilicon layer.

Figure 4A:
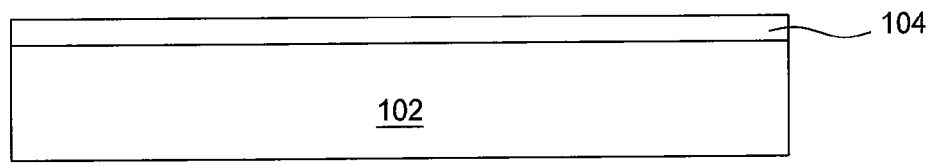
FIGS. 4A-4D depict an embodiment of a device structure having an amorphous silicon layer shown in stages of a sequence for transforming the amorphous silicon layer into a polysilicon layer in accordance with an embodiment of the present invention.

The process 300 begins at step 302 by transferring the substrate 102, as shown in FIG. 4A, into a process chamber, such as the PECVD chamber 200 depicted in FIG. 2. The substrate 102 may have the optional dielectric layer 104 disposed thereon. It is noted that the substrate 102 may have different combination of films, structures or layers previously formed thereon to facilitate forming different device structures on the substrate 102. In the embodiment wherein the dielectric layer 104 is not present, the amorphous silicon layer may be formed on the substrate 102 directly.

In one embodiment, the substrate 102 may be any one of glass substrate, plastic substrate, polymer substrate, metal substrate, singled substrate, roll-to-roll substrate, or other suitable transparent substrate suitable for forming a thin film transistor thereon.

Figure 4B:
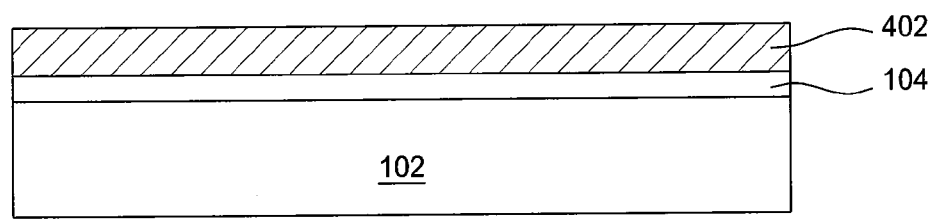

At step 304, a gas mixture is supplied into the processing chamber through the gas distribution plate 210 to deposit an amorphous silicon layer 402 on the substrate 102, as depicted in FIG. 4B. When supplying the gas mixture into the processing chamber to deposit the amorphous silicon layer 402, the gas mixture may include a silicon-based gas, an inert gas and substantially no hydrogen gas ($H_2$). The term "substantially no hydrogen gas" is intended to mean that a direct source of hydrogen gas is not utilized to form the gas mixture. Trace amount of hydrogen gas within the source of the inert gas and/or silicon-based gas may be present. Suitable silicon-based gases include, but are not limited to, silane ($SiH_4$), disilane ($Si_2H_6$), silicon tetrafluoride ($SiF_4$), tetraorthosiloxane (TEOS), silicon tetrachloride ($SiCl_4$), dichlorosilane ($SiH_2Cl_2$), and combinations thereof. Suitable examples of the inert gas include He, Ar, Ne, Kr or the like. In one embodiment, the silicon-based gas described herein is silane ($SiH_4$) gas and the inert gas is Ar.

The silicon-based gas and inert gas are supplied at a predetermined gas flow ratio. The predetermined gas flow ratio of inert gas to silicon-based gas assists deposition of the amorphous silicon layer with a minimum number of hydrogen atoms included in the film. In one embodiment, the silicon-based gas and the inert gas are supplied into the processing chamber at a predetermined ratio, such as greater than 1:20. In one embodiment, the ratio (R) of the inert gas (such as argon gas) to the silicon-based gas (such as silane) is controlled about greater than 20 ($Ar/SiH_4$), for example greater than 50, such as between about 60 and about 200, and in another example, about between about 70 and 100, such as about 75. Alternatively, the silicon-based gas and inert gas supplied into the processing chamber may be supplied by volumetric flow rate per substrate surface area (or substrate support surface, as an approximate equivalence). In one embodiment, the $SiH_4$ gas may be supplied at between about 0.042 sccm/$cm^2$ and about 0.31 sccm/$cm^2$ into the processing chamber while inert gas may be supplied at a flow rate at between about 0.55 sccm/$cm^2$ and about 3.29 sccm/$cm^2$ into the processing chamber. Thus, the ratio of volumetric flow rate per substrate surface area for insert gas to silicon-based gas is between about 1.8:1 to about 79:1. In other words, the gas mixture has a volumetric flow rate per surface area of substrate for the inert gas that is between about 1.8 times to about 79 times a volumetric flow rate per surface area of substrate for the silicon-based gas. In one embodiment, the silicon-based gas is silane and the inert gas is argon.

It is believed that the inert gas (for example argon) supplied in the gas mixture has a relatively higher molecular weight than silicon and hydrogen atoms supplied in the silicon-based gas (for example silane gas). When supplying the gas mixture during processing, the argon atoms in the gas mixture may assist driving out the weak and dangling bonds of the silicon-hydrogen and/or weak silicon-silicon bonding in the silicon layer, thereby allowing the silicon atoms in the silicon layer to form strong silicon to silicon bonds, rather than silicon-hydrogen bonds from the silane gas. As discussed above, strong silicon to silicon bonding promotes film purity and high silicon bonding energy, thereby increasing the film quality and purity formed in the amorphous silicon layer 402. Furthermore, as the Ar atoms assist forming strong and robust silicon bonding and drive out impurities, not only defects in the silicon layer are reduced, but also good uniformity may be obtained in the amorphous silicon layer so that the undesired random grain boundary and grain boundary defects may be reduced. In addition, by using argon dilution instead of the conventional hydrogen dilution, supply of hydrogen atoms during deposition process may be minimized or eliminated, thereby reducing possibility of forming hydrogen elements in the resultant amorphous silicon layer 402. It is also believed that argon dilution deposition process may also provide a good deposition rate, such as greater than 300 Å per minute, so as to improve throughput of manufacture.

Several process parameters may be controlled during deposition process. A RF source power may be applied to maintain the plasma during deposition. In one embodiment, the RF source power density may be supplied between about 10 mWatt/cm$^2$ and about 200 mWatt/cm$^2$. Alternatively, a VHF power may be utilized to provide a frequency up to between about 27 MHz and about 200 MHz. The process pressure is maintained at between about 0.1 Torr and about 10 Torr, such as between about 0.5 Torr and about 5 Torr, such as about 0.8 Torr and about 2 Torr. The spacing of the substrate to the gas distribution plate assembly may be controlled in accordance with the substrate dimension. In one embodiment, the processing spacing for a substrate greater than 1 square meters is controlled between about 400 mils and about 1200 mils, for example, between about 400 mils and about 850 mils, such as 580 mils. The substrate temperature may be controlled at between about 150 degrees Celsius and about 500 degrees Celsius, such as about 370 degrees Celsius.

In one embodiment, a relatively lower RF power, such as lower than 1500 Watts or less than 100 mWatt/cm$^2$, may be utilized. It is believed that lower RF power utilized during deposition can assist forming the amorphous silicon layer 402 with good uniformity control. It is believed that relatively lower RF power as utilized can reduce the sputtering effect that may be produced by the inert gas, thereby assisting depositing the amorphous silicon layer 402 in a relatively gentle plasma environment, thereby forming the amorphous silicon layer 402 with good uniformity and surface roughness control.

Figure 4C:
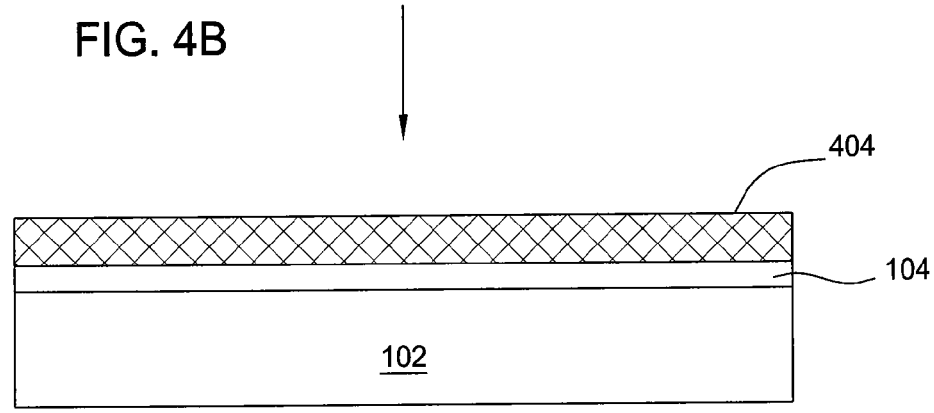

At step 306, after the amorphous silicon layer 402 is formed on the substrate 102, a post dehydrogenation bake process may be performed to remove hydrogen from the amorphous silicon layer 402, as shown in FIG. 4C. After the post dehydrogenation bake process, hydrogen content contained in the amorphous silicon layer 402 may be mostly driven out to form a dehydrogenated amorphous silicon layer 404, as shown in FIG. 4C. As discussed above, as the dehydrogenated amorphous silicon layer 404 is formed by a substantially hydrogen free gas mixture, using an inert gas, such as argon gas as dilution gas instead of hydrogen gas, the post dehydrogenation bake process may be performed for a relatively short time frame, such as less than 5 minute or may be optionally eliminated.

In one embodiment, the post dehydrogenation bake process may be performed in-situ process in the processing chamber wherein the amorphous silicon layer 402 was deposited. The post dehydrogenation bake process may heat the substrate 102 to a temperature greater than 400 degrees Celsius, such as about 450 degrees Celsius and about 550 degree Celsius, to assist evaporating the hydrogen elements to form the dehydrogenated amorphous silicon layer 404.

In the embodiment wherein the hydrogen content is not high in the amorphous silicon layer 402, the post dehydrogenation bake process performed at step 306 may be eliminated, if desired.

Figure 4D:
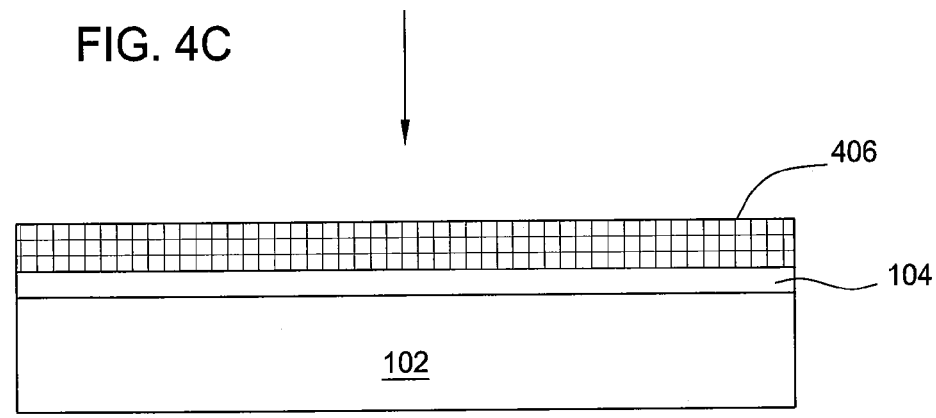

At step 308, after the post dehydrogenation bake process, a laser annealing process is performed to transform the dehydrogenated amorphous silicon layer 404 into a polysilicon layer 406, as shown in FIG. 4D. The laser process assists crystallizing the dehydrogenated amorphous silicon layer 404 into the polysilicon layer 406. The thermal energy provided during the laser annealing process assist growing the grains from the amorphous silicon layer 402 into large sizes into crystallized grains, forming the polysilicon layer 406. In one embodiment, the laser annealing process as utilized to crystallize the amorphous silicon layer 404 is an excimer laser annealing process. The laser annealing process may be thermally process the substrate to a temperature between about 100 degrees Celsius and about 1500 degrees Celsius.

After the laser annealing process, the dehydrogenated amorphous silicon layer 404 is transformed into the polysilicon layer 406 having crystal orientation mostly in plane (111) with some orientation in plane (220). As desired crystallization of polysilicon layer 406 is formed, a high photo/dark conductivity ratio may be obtained and the overall electrical properties of the polysilicon layer 406 may be improved.

After the dehydrogenated amorphous silicon layer 404 is turned into the polysilicon layer 406, a patterning process, ion implantation or other deposition process may be performed to form the source and drain areas, gate dielectric layers and source and drain electrode layer so as to complete the TFT device structures, as shown and discussed above with referenced to FIG. 1.

Figure 5A:
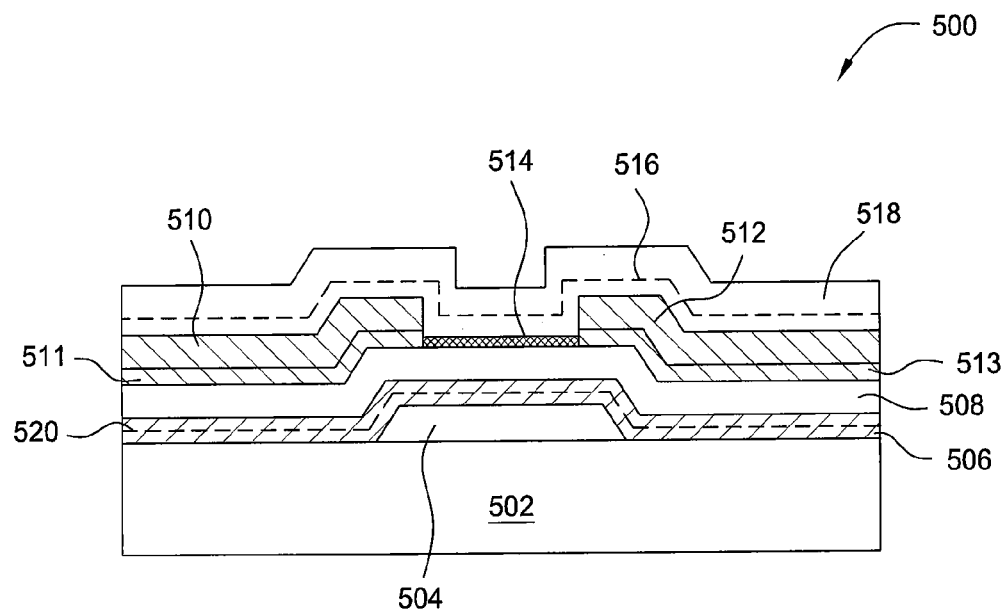
FIG. 5A-5B are schematic cross-sectional view of TFT devices according to one embodiment.

As mentioned above, the silicon containing layer can be utilized in fabricating other layers in a TFT device. FIG. 5A is a schematic cross-sectional view of another embodiment of a TFT device 500 according to another embodiment of the present invention. The TFT device 500 includes a substrate 502 having a gate electrode layer 504 formed thereover. The substrate 502 may comprise glass, but other substrate materials are contemplated such as polymer based substrates and flexible substrates. In one embodiment, the gate electrode layer 504 may be fabricated from any suitable metallic materials, such as indium tin oxide (ITO), indium zinc oxide (IZO), indium tin zinc oxide (ITZO), aluminum (Al), tungsten (W), chromium (Cr), tantalum (Ta), molybdenum (Mo), copper (Cu), titanium (Ti), alloys thereof or combination thereof.

Over the substrate 502 and the gate electrode layer 504, a gate insulating layer 506 is formed. Suitable materials for the gate insulating layer 506 may be silicon oxide (SiO$_2$), silicon oxynitride (SiON), silicon nitride (SiN), combinations thereof or the like. The gate insulating layer 506 may be in form of a single layer, a composite layer, dual layers, multiple layers, or other combinations thereof as needed. In one embodiment, the gate insulating layer 506 may has silicon nitride layer disposed on a silicon oxide to form as a dual layer on the substrate 502, as shown by a dotted line 520, or vise versa. Alternatively, the gate insulating layer 506 may be a single silicon oxide layer or a single silicon nitride layer as needed. The silicon oxide layer and the silicon nitride layer (or a silicon oxynitride layer) may be fabricated from the process 300 as described above. The silicon oxide and/or the silicon nitride layer may be fabricated by supplying a gas mixture having a silicon-based gas and an inert gas, such as argon, with no hydrogen gas.

In the embodiment wherein a silicon oxide layer is configured to be formed, the gas mixture includes a silicon-based gas, oxygen containing gas and inert gas. Suitable examples of the silicon-based gases include, but are not limited to, silane ($SiH_4$), disilane ($Si_2H_6$), tetraorthosiloxane (TEOS), silicon tetrafluoride ($SiF_4$), silicon tetrachloride ($SiCl_4$), dichlorosilane ($SiH_2Cl_2$), and combinations thereof. Suitable examples of the oxygen containing gas include $O_2$, $N_2O$, $NO_2$, $H_2O$, $H_2O_2$, $O_3$, and the like. Suitable examples of the inert gas include He, Ar, Ne, Kr or the like. In one particular embodiment, the gas mixture for forming silicon oxide layer formed here includes $SiH_4$, $O_2$ and Ar gas, or $SiH_4$, $N_2O$ or $NO_2$, and Ar gas. However, it is to be noted that if TEOS is utilized as the silicon-based precursor, $O_2$ is preferably not used due to the high total oxygen content in the chamber.

In the embodiment wherein a silicon nitride layer is formed, the gas mixture includes a silicon-based gas, nitrogen containing gas and inert gas. The types of the silicon-based gas and the inert gas may be used are described above. Suitable examples of the nitrogen containing gas include $N_2$, $N_2O$, $NO_2$, NO, or $NH_3$, and the like. In one particular embodiment, the gas mixture for forming silicon oxide layer formed here includes $SiH_4$, $N_2$ or $NH_3$ and Ar gas.

Because an inert gas is utilized, less RF power is necessary as compared to when no inert gas is utilized. Specifically, about a 20 percent reduction in RF power is possible. The reduction in RF power is possible because the inert gas atoms are heavy and thus enhanced ion bombardment during processing. A suitable RF power that may be applied is between about 1200 $mW/cm^2$ to about 1300 $mW/cm^2$. Furthermore, when delivering the silicon-based gas and the inert gas to the chamber at a specific ratio, not only decreases the amount of RF power necessary, but also increases the uniformity of the film deposition thickness. Thus, the addition of the inert gas leads to repeatable, reliable, and high quality silicon oxide films. In one embodiment, a volumetric flow rate per substrate surface area for inert gas (such as argon) may be between about 1.05 $sccm/cm^2$ and about 1.828 $sccm/cm^2$, such as 1.65 $sccm/cm^2$. The silicon containing precursor may be delivered at a volumetric flow rate per substrate surface area of between about 0.023 $sccm/cm^2$ to about 0.095 $sccm/cm^2$, such as about 0.025 $sccm/cm^2$. The oxygen containing precursor may be delivered at a volumetric flow rate per substrate surface area of between about 1.05 $sccm/cm^2$ to about 1.66 $sccm/cm^2$, such as about 1.16 $sccm/cm^2$. Thus, the amount of inert gas is about 11 to about 80 times larger than the amount of silicon-based precursor delivered. The amount of inert gas is about 0.6 to about 1.70 times larger than the amount of oxygen based gas delivered. The amount of oxygen based gas is between about 11 to about 72 times larger than the amount of silicon-based precursor delivered.

Furthermore, it is noted that the process parameters may be similarly controlled from the process parameters controlled for forming the amorphous silicon layer described above with referenced to the step 304 with referenced to process 300 as needed.

Subsequently, an active channel 508 may be disposed on the gate insulating layer 506. The active channel 508 may be the low temperature polysilicon layer (LTPS) manufactured by the process described above with referenced to FIG. 3. Suitable dopants, such as n-type or p-type dopants, may be disposed into the low temperature polysilicon layer (LTPS) as needed to form the active channel 508. Over the active channel 508, an optional etch stop 514 may be formed to protect the active channel 508 during formation of the source and drain electrodes 510, 512. Suitable materials that may be utilized for the etch stop 514 include silicon oxide, silicon nitride and silicon oxynitride. The etch stop 514 may be formed by a process similar to the process utilized to form the gate insulating layer 506 as described above. In some embodiments, another active layer 511, 513 may be formed prior to the source and drain electrodes 510, 512. The active layer 511, 513 may be a p-type active layer or an n-type active layer, such as a n-type silicon containing layer or a p-type silicon containing layer.

Over the source and drain electrodes 510, 512, as well as an optional etch stop 514 (if present), a passivation layer 518 may be formed. Suitable materials that may be utilized for the passivation layer 518 include silicon oxide, silicon nitride and silicon oxynitride. In one embodiment, similar to the gate insulating layer 506 described above, the passivation layer 518 may be in form of a single layer, a composite layer, dual layers, multiple layers, or other combinations thereof as needed. In one embodiment, the passivation layer 518 may has silicon nitride layer disposed on a silicon oxide to form as a dual layer on the source and drain electrodes 510, 512, as shown by a dotted line 516, or vise versa. The silicon oxide layer and the silicon nitride layer (or a silicon oxynitride layer) may be fabricated from the process 300 as described above or the silicon oxide layer and the silicon nitride layer may also be formed from the process described above utilized to form the gate insulating layer 506. The silicon oxide and/or the silicon nitride layer may be fabricated by supplying a gas mixture having a silicon-based gas and an inert gas, such as argon, with no hydrogen gas. Alternatively, the passivation layer may be a single silicon oxide layer or a single silicon nitride layer.

Figure 5B:
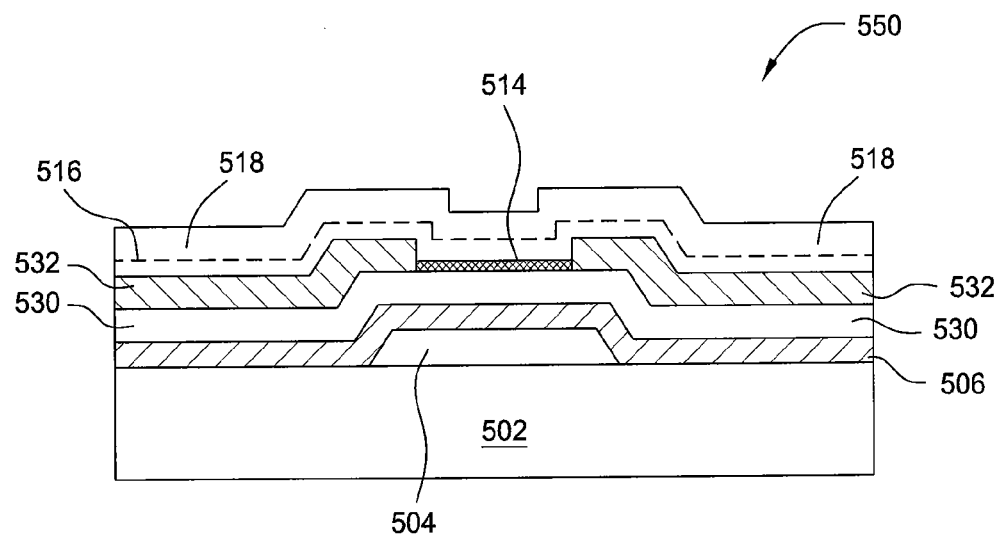

FIG. 5B depicts an embodiment of metal oxide TFT devices 550 that may be utilized according to one embodiment of the present invention. The metal oxide TFT devices 550 may have a similar structure of the LTPS TFT devices 500 described above with referenced to FIG. 5A, except that the material of the active channel 508 is different. The metal oxide TFT devices 550 include an active channel 530 fabricated from a metal containing layer. Suitable examples of the active channel 530 formed in the metal oxide TFT devices 550 includes InGaZnO, InGaZnON, ZnO, ZnON, ZnSnO, CdSnO, GaSnO, TiSnO, CuAlO, SrCuO, LaCuOS, GaN, InGaN, AlGaN or InGaAlN, among others. In one particular embodiment, the active channel 530 is a InGaZnO (IGZO) layer. Similarly, the gate insulating layer 506 and the passivation layer 518 may also be in form of a single layer, a composite layer, dual layers, multiple layers, or other combinations thereof as needed. In one example, the passivation layer 518 and the gate insulating layer 506 may be a dual layer having a silicon nitride layer disposed on a silicon oxide.

When the substantially hydrogen free silicon oxide layer fabricated from the argon dilution gas is used in a metal oxide TFT device, the metal oxide TFT device can have improved electrical performance. For example, the $V_{on}$ (turn on voltage) and S value (sub-threshold voltage swing) are both reduced significantly. In one example, $V_{on}$ is reduced from about $-5.5$ V to about $-0.25$ V. S value is reduced from 0.7 V/decade to 0.4 V/decade. $I_{on}$ (on-currents) is reduced from 3.3E−04 to 1.4E−04 A. $I_{off}$ (off-currents) is reduced from 4.8E−12 A to 1.4E−13 A. Mobility (Mo) is increased from about 9.8 $cm^2$/(V·s) to about 9.9 $cm^2/(V·s)$.

Figure 6:
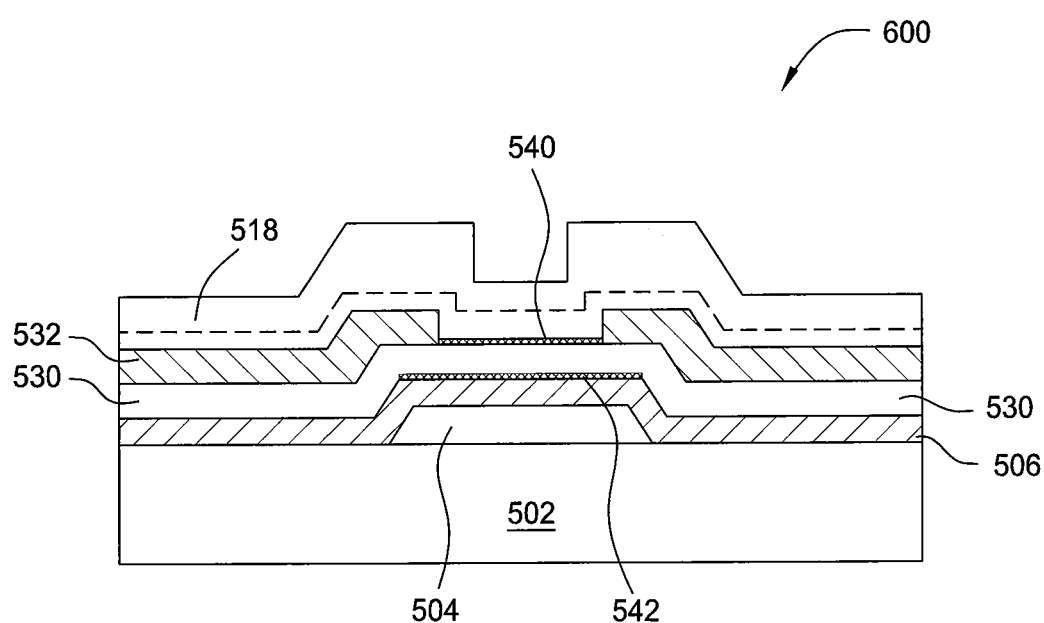
FIG. 6 is a schematic cross-sectional view of a TFT device according to one embodiment.

FIG. 6 depicts an embodiment of metal oxide TFT devices 600 that may be utilized according to one embodiment of the present invention. The metal oxide TFT devices 600 may have a similar structure of the metal oxide TFT devices 550 described above with referenced to FIG. 5B. The metal oxide TFT devices 600 also include an active channel 530 fabricated from a metal containing layer. Suitable examples of the active channel 530 formed in the metal oxide TFT devices 600 includes InGaZnO, InGaZnON, ZnO, ZnON, ZnSnO, CdSnO, GaSnO, TiSnO, CuAlO, SrCuO, LaCuOS, GaN, InGaN, AlGaN or InGaAlN, among others. Additionally, an upper interface 540 and a lower interface 542 in contact with the active channel 530 are configured to have a film property substantially without hydrogen. The upper interface 540 and the lower interface 542 are made from a hydrogen free material. For example, the lower interface 542 is formed between the active channel 530 and the gate insulating layer 506. In this case, the gate insulating layer 506 may be selected to form from a substantially hydrogen free silicon oxide layer, as described above with referenced to TFT devices described in FIGS. 5A-5B. In the embodiment wherein the gate insulating layer 506 is configured to be as a dual layer, the gate insulating layer 506 may have a silicon nitride layer disposed on the substrate 502 and a substantially hydrogen free silicon oxide layer disposed on the silicon nitride layer to be in contact with the active channel 530. Similarly, the upper interface 540 is formed between the active channel 530 and passivation layer 518 defined by an opening of the source and drain channel 532. The upper interface 540 may also be selected to form from a substantially hydrogen free silicon oxide layer, as described above with referenced to TFT devices described in FIGS. 5A-5B. In the embodiment wherein the passivation layer 518 is configured to be as a dual layer, the passivation layer 518 may have a hydrogen free silicon oxide layer disposed on the active channel 530 in contact with the active channel 530 and a silicon nitride layer disposed on the hydrogen free silicon oxide layer.

Alternatively, additional layers may also be formed at the interfaces 542, 540 as interface protection layers. In one embodiment, an etch stop layer may also be utilized as the interface protection layer formed at the interfaces 542, 540 to maintain the interfaces substantially free from hydrogen. Similarly, in one example, the interface protection layers are substantially hydrogen free silicon oxide layers, as described above with referenced to TFT devices described in FIGS. 5A-5B. In another example, the interface protection layers are metal containing dielectric layers, such as TaN, TiN, WN, CuN, and any other suitable materials substantially free from hydrogen (e.g., with minimum hydrogen content).

It is believed that maintaining substantially hydrogen free interfaces 540, 542 to be in contact with the active channel 530 may reduce the likelihood of hydrogen attack to the active channel, thereby obtaining a high quality interface so as to improve the electronic performance to the metal oxide TFT devices 600.

It is noted that the silicon nitride layer used in the present application may also be obtained by any other suitable processes or techniques available in the art.

Thus, the methods described herein advantageously improve the electron mobility, stability and uniformity of electric devices by minimizing the hydrogen content of a silicon containing layer so as to improve device performance.

While the foregoing is directed to embodiments of the present invention, other and further embodiments of the invention may be devised without departing from the basic scope thereof, and the scope thereof is determined by the claims that follow.

The invention claimed is:

1. A method for forming a silicon layer on a substrate comprising:
    transferring a substrate into a processing chamber;
    supplying a gas mixture having a silicon-based gas, an inert gas and substantially no hydrogen gas into the processing chamber, the gas mixture having a volumetric flow rate per surface area of substrate of the inert gas that is between about 1.8 times to about 79 times a volumetric flow rate per surface area of substrate of the silicon-based gas; and
    applying a RF power to ignite the gas mixture into a plasma; and
    forming an amorphous silicon layer on the substrate in the presence of the plasma;
    in-situ thermal treating the substrate after the amorphous silicon layer is formed on the substrate to a temperature between about 450 degrees Celsius and about 500 degrees Celsius in the processing chamber for less than 5 minutes; and
    laser annealing the amorphous silicon layer to form a polysilicon layer having predominately crystalline plane in <111> and in <220>.

2. The method of claim 1, wherein the laser annealing further comprises:
    heating the substrate to a temperature between about 100 degrees Celsius and about 1500 degrees Celsius.

3. The method of claim 1, wherein applying the RF power further comprises:
    supplying a RF source power less than 1500 Watts.

4. The method of claim 1, wherein supplying the gas mixture further comprises:
    maintaining the process pressure at between about 0.5 Torr and about 5 Torr.

5. A method for forming a silicon oxide layer, comprising:
    supplying a gas mixture having a silicon-based gas, an inert gas, and an oxygen containing gas into a processing chamber, the gas mixture having a volumetric flow rate per surface area of substrate of the inert gas that is between about 11 times to about 80 times a volumetric flow rate per surface area of substrate of the silicon-based gas; and
    applying a RF power to ignite the gas mixture into a plasma;
    forming a silicon oxide layer on the substrate; and
    in-situ thermal treating the substrate after the silicon oxide layer is formed on the substrate to a temperature between about 450 degrees Celsius and about 500 degrees Celsius in the processing chamber for less than 5 minutes.

6. The method of claim 5, wherein the silicon-based gas comprises silane.

7. The method of claim 6, wherein the oxygen containing gas comprises $O_2$.

8. The method of claim 6, wherein the oxygen containing gas comprises $N_2O$.

9. The method of claim 5, wherein the silicon-based gas comprises TEOS.

10. The method of claim 9, wherein the oxygen containing gas comprises $N_2O$.

11. The method of claim 5, wherein the gas mixture has a volumetric flow rate per surface area of substrate of the inert gas that is between about 0.6 times to about 1.7 times a volumetric flow rate per surface area of substrate of the oxygen containing gas.

12. The method of claim 11, wherein the silicon-based gas comprises silane.

13. The method of claim 11, wherein the oxygen containing gas comprises $O_2$ or $N_2O$.

14. The method of claim 11, wherein the gas mixture has a volumetric flow rate per surface area of substrate of the oxygen containing gas that is between about 11 times to about 72 times a volumetric flow rate per surface area of substrate of the silicon containing gas.

15. The method of claim 5, wherein the gas mixture has a volumetric flow rate per surface area of substrate of the oxygen containing gas that is between about 11 times to about 72 times a volumetric flow rate per surface area of substrate of the silicon containing gas.

16. A metal oxide TFT device, comprising:
a substrate;
a gate insulating layer disposed on the substrate, wherein the gate insulating layer includes a substantially hydrogen free silicon oxide layer;
an active channel disposed on the gate insulating layer, wherein the active channel includes at least one of InGaZnO, InGaZnON, ZnO, ZnON, ZnSnO, CdSnO, GaSnO, TiSnO, CuAlO, SrCuO, LaCuOS, GaN, InGaN, AlGaN or InGaAlN;
a source-drain electrode disposed on the active channel; and
a passivation layer disposed on the source-drain electrode layer, wherein the passivation layer includes a substantially hydrogen free silicon oxide layer, wherein the substantially hydrogen free silicon oxide layer is made by the following steps:
supplying a gas mixture having a silicon-based gas, an inert gas, and an oxygen containing gas into a processing chamber, the gas mixture having a volumetric flow rate per surface area of substrate of the inert gas that is between about 11 times to about 80 times a volumetric flow rate per surface area of substrate of the silicon-based gas;
applying a RF power to ignite the gas mixture into a plasma; and
forming a substantially hydrogen free silicon oxide layer on the substrate; and
in-situ thermal treating the substrate after the silicon oxide layer is formed on the substrate to a temperature between about 450 degrees Celsius and about 500 degrees Celsius in the processing chamber for less than 5 minutes.

* * * * *